US009825475B2

United States Patent
Smith et al.

(10) Patent No.: US 9,825,475 B2
(45) Date of Patent: Nov. 21, 2017

(54) SYSTEM AND METHOD FOR AUTOMATED DETECTION OF BATTERY INSERT

(75) Inventors: Richard Smith, Campbell, CA (US); Jeffrey Resnick, Foster City, CA (US)

(73) Assignee: Zoll Circulation, Inc., San Jose, CA (US)

( * ) Notice: Subject to any disclaimer, the term of this patent is extended or adjusted under 35 U.S.C. 154(b) by 1146 days.

(21) Appl. No.: 13/458,988

(22) Filed: Apr. 27, 2012

(65) Prior Publication Data

US 2012/0277642 A1 Nov. 1, 2012

Related U.S. Application Data

(60) Provisional application No. 61/522,203, filed on Aug. 10, 2011, provisional application No. 61/480,286, filed on Apr. 28, 2011.

(51) Int. Cl.
| | |
|---|---|
| *H02J 7/00* | (2006.01) |
| *G01R 31/04* | (2006.01) |
| *A61H 31/00* | (2006.01) |
| *A61H 11/00* | (2006.01) |

(52) U.S. Cl.
CPC .......... *H02J 7/0029* (2013.01); *H02J 7/0014* (2013.01); *H02J 7/0036* (2013.01); *A61H 31/006* (2013.01); *A61H 2011/005* (2013.01); *G01R 31/041* (2013.01); *H02J 2007/0001* (2013.01)

(58) Field of Classification Search
CPC ...... H02J 7/0029; H02J 7/0036; G01R 31/041
See application file for complete search history.

(56) References Cited

U.S. PATENT DOCUMENTS

| | | | | |
|---|---|---|---|---|
| 4,302,714 A | * | 11/1981 | Yefsky | G01R 31/3624 320/131 |
| 4,792,743 A | | 12/1988 | Tsujino et al. | |
| 4,843,224 A | * | 6/1989 | Ohta | G06K 7/0008 235/487 |
| 5,047,663 A | * | 9/1991 | Lee | H01L 27/0218 326/62 |
| 5,534,765 A | | 7/1996 | Kreisinger et al. | |

(Continued)

FOREIGN PATENT DOCUMENTS

| | | |
|---|---|---|
| EP | 0494505 A2 | 7/1992 |
| EP | 1987990 A1 | 11/2008 |

(Continued)

OTHER PUBLICATIONS

International Search Report from corresponding International Application No. PCT/US2012/035643 dated Jul. 31, 2012.

(Continued)

*Primary Examiner* — Thienvu Tran
*Assistant Examiner* — Pinping Sun
(74) *Attorney, Agent, or Firm* — Rutan & Tucker LLP; John K. Fitzgerald

(57) ABSTRACT

A rechargeable power cell having no voltage across its positive and negative power terminals unless the power cell is inserted into a device configured to accept the power cell is described. The power cell includes a battery management processor and battery insertion detection circuitry that cooperate to determine when the power cell is inserted into the device and then drive an electronic switch to provide for conduction of current from the power cell to the positive terminal of the cell.

21 Claims, 9 Drawing Sheets

(56) References Cited

U.S. PATENT DOCUMENTS

| | | | |
|---|---|---|---|
| 5,857,108 A * | 1/1999 | Hong | G06F 13/24 710/260 |
| 5,926,545 A | 7/1999 | Wu | |
| 5,936,384 A * | 8/1999 | Fujiwara | H02J 7/0031 320/112 |
| 6,064,804 A | 5/2000 | Brink et al. | |
| 6,087,803 A * | 7/2000 | Eguchi | G06F 1/26 320/106 |
| 6,130,519 A * | 10/2000 | Whiting | H02J 7/0034 320/105 |
| 6,169,387 B1 | 1/2001 | Kaib et al. | |
| 6,194,869 B1 * | 2/2001 | Peterzell | H02H 3/12 320/134 |
| 6,730,432 B1 | 5/2004 | Grosfeld et al. | |
| 6,771,042 B2 | 8/2004 | Chen et al. | |
| 6,806,681 B1 | 10/2004 | Cheiky et al. | |
| 6,888,354 B1 * | 5/2005 | Gofman | H02J 7/0031 320/137 |
| 7,049,859 B2 * | 5/2006 | Boyer | F02P 7/077 327/73 |
| 7,122,014 B2 | 10/2006 | Palazzolo | |
| 7,183,748 B1 * | 2/2007 | Unno | H02J 7/0013 320/134 |
| 7,728,548 B2 | 6/2010 | Daynes et al. | |
| 7,880,434 B2 | 2/2011 | White et al. | |
| 8,552,689 B2 * | 10/2013 | Wang | H01M 10/44 320/134 |
| 8,643,339 B2 * | 2/2014 | Iwamura | H01M 2/34 320/136 |
| 2001/0035732 A1 | 11/2001 | Sakakibara | |
| 2002/0123325 A1 * | 9/2002 | Cooper | H04L 63/0492 455/411 |
| 2005/0174813 A1 | 8/2005 | Dou et al. | |
| 2005/0175350 A1 | 8/2005 | Hartzell et al. | |
| 2007/0182373 A1 | 8/2007 | Sakakibara et al. | |
| 2008/0224669 A1 | 9/2008 | Nishida | |
| 2008/0238370 A1 | 10/2008 | Carrier et al. | |
| 2008/0309313 A1 * | 12/2008 | Farrar | G06F 1/266 323/351 |
| 2009/0130542 A1 * | 5/2009 | Mizoguchi | H01M 10/4207 429/61 |
| 2009/0267609 A1 | 10/2009 | Suzuki | |
| 2010/0181968 A1 * | 7/2010 | Kuo | H02J 7/0031 320/163 |
| 2010/0182155 A1 * | 7/2010 | Ju | H02J 7/0052 340/636.1 |
| 2010/0213891 A1 * | 8/2010 | Nishikawa | H01M 10/42 320/106 |
| 2010/0241039 A1 | 9/2010 | Hall et al. | |
| 2010/0253357 A1 * | 10/2010 | Seo | G01R 19/16542 324/427 |
| 2011/0260755 A1 * | 10/2011 | Littow | H02J 7/0008 327/58 |

FOREIGN PATENT DOCUMENTS

| | | |
|---|---|---|
| JP | 2001298870 A | 10/2001 |
| WO | 0187020 A1 | 11/2001 |
| WO | 2006082425 A1 | 8/2006 |
| WO | 2009070663 A1 | 6/2009 |

OTHER PUBLICATIONS

International Search Report for PCT/US2012/035667 dated Oct. 29, 2012.
International Search Report for PCT/US2012/035675 dated Nov. 14, 2012.
International Search Report for PCT/US2012/035673 dated Nov. 1, 2012.
International Search Report for PCT/US2012/035579 dated Nov. 28, 2012.
International Search Report from KIPO dated Oct. 29, 2012.
Zoll Circulation, "AutoPulse Resuscitation System Model 100 Battery Charger User Guide," P/N. 10762-001 Rev. 8, Copyright 2009, p. 1-36.
Zoll Circulation, "AutoPulse Resuscitation System Model 100 User Guide," P/N. 11440-001, Rev. 3, Copyright, p. 2009, p. 1-86.
Texas Instruments, "MSP430F241x, MSP430F261x, Mixed Signal Microcontroller," Copyright 2009, p. 1-102.
Texas Instruments Incorporated, "SBS v1.1-Compliant Gas Gauge IC," bq2060A, SLUS500B—Oct. 2001—Revised Sep. 2005, Copyright 2001-2005, p. 1-57
Koninklijke Philips Electronics N.V., "PMGD780SN Dual N-channel μTrench MOS standard level FET," Rev. Feb. 1-11, 2004, p. 1-12.
O2 Micro, "OZ8800 Second Level Battery Protection," Dec. 5, 2008, p. 1-16.
O2 Micro, "OZ890 Battery Pack Protection and Monitor IC," Apr. 15, 2009, p. 1-83.

* cited by examiner

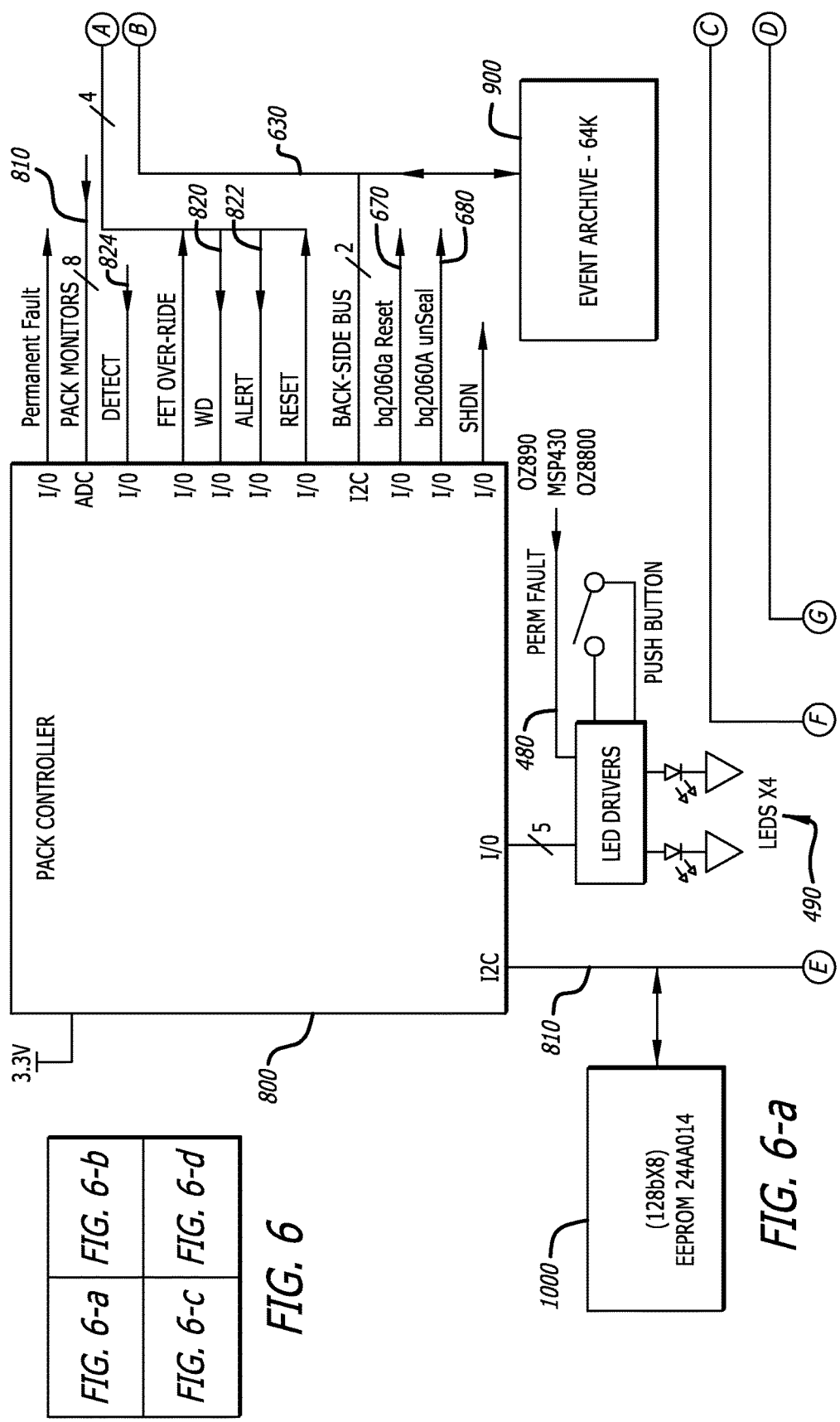

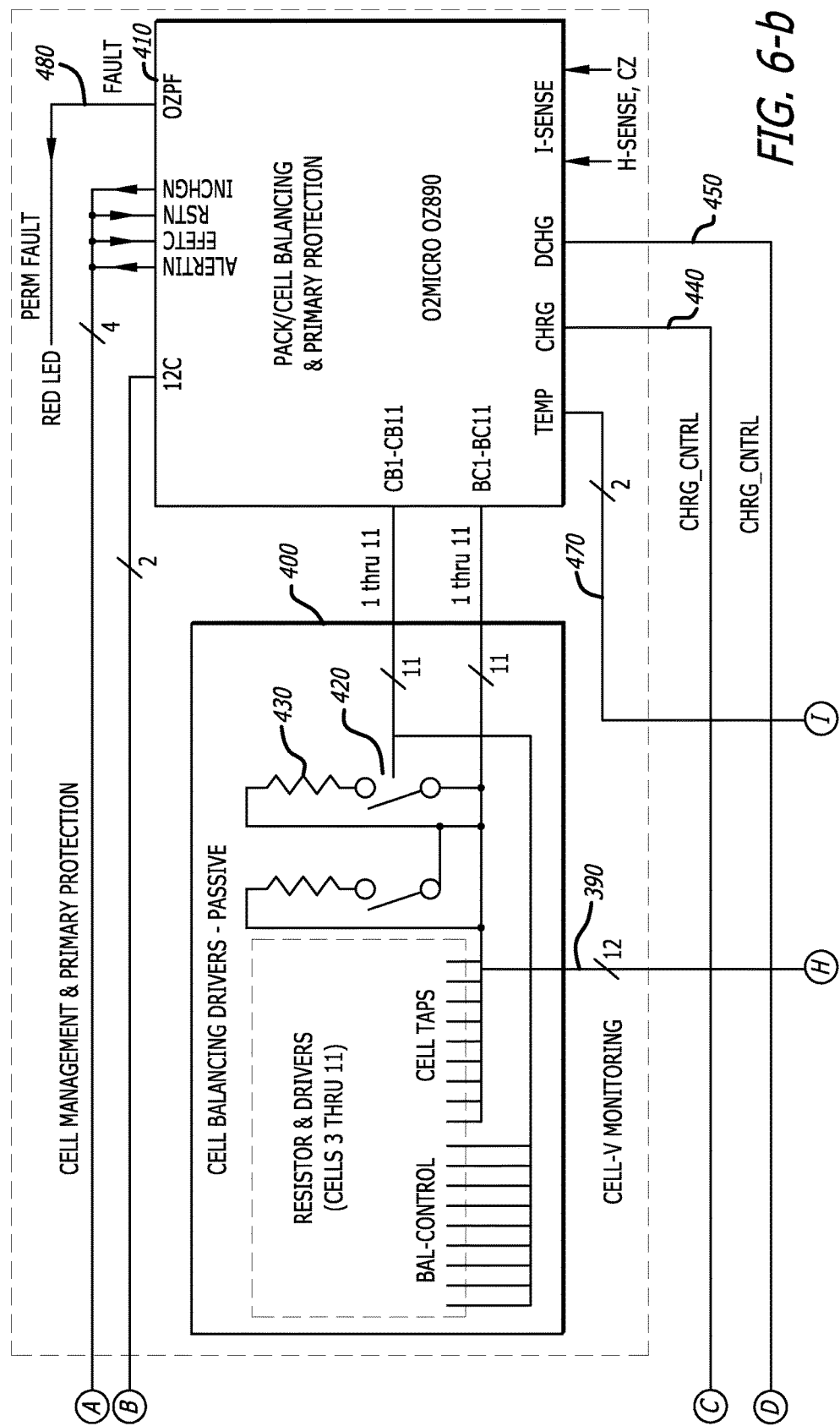
FIG. 6-b

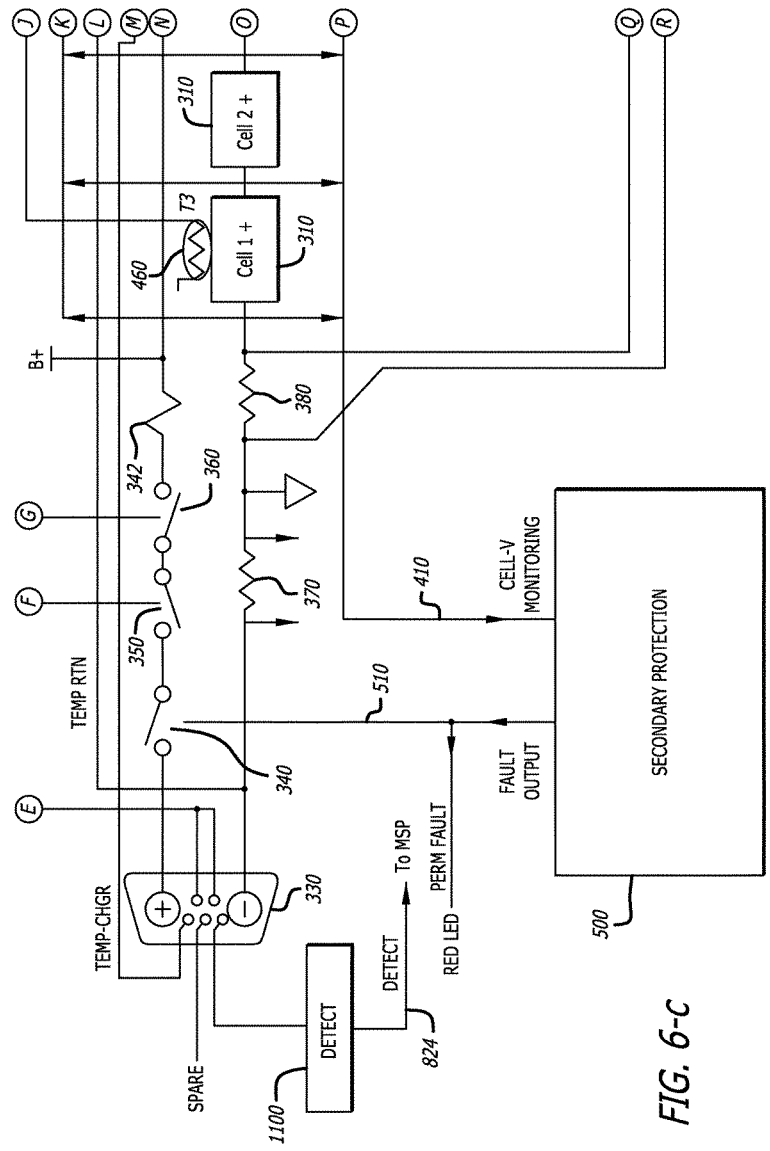
FIG. 6-C

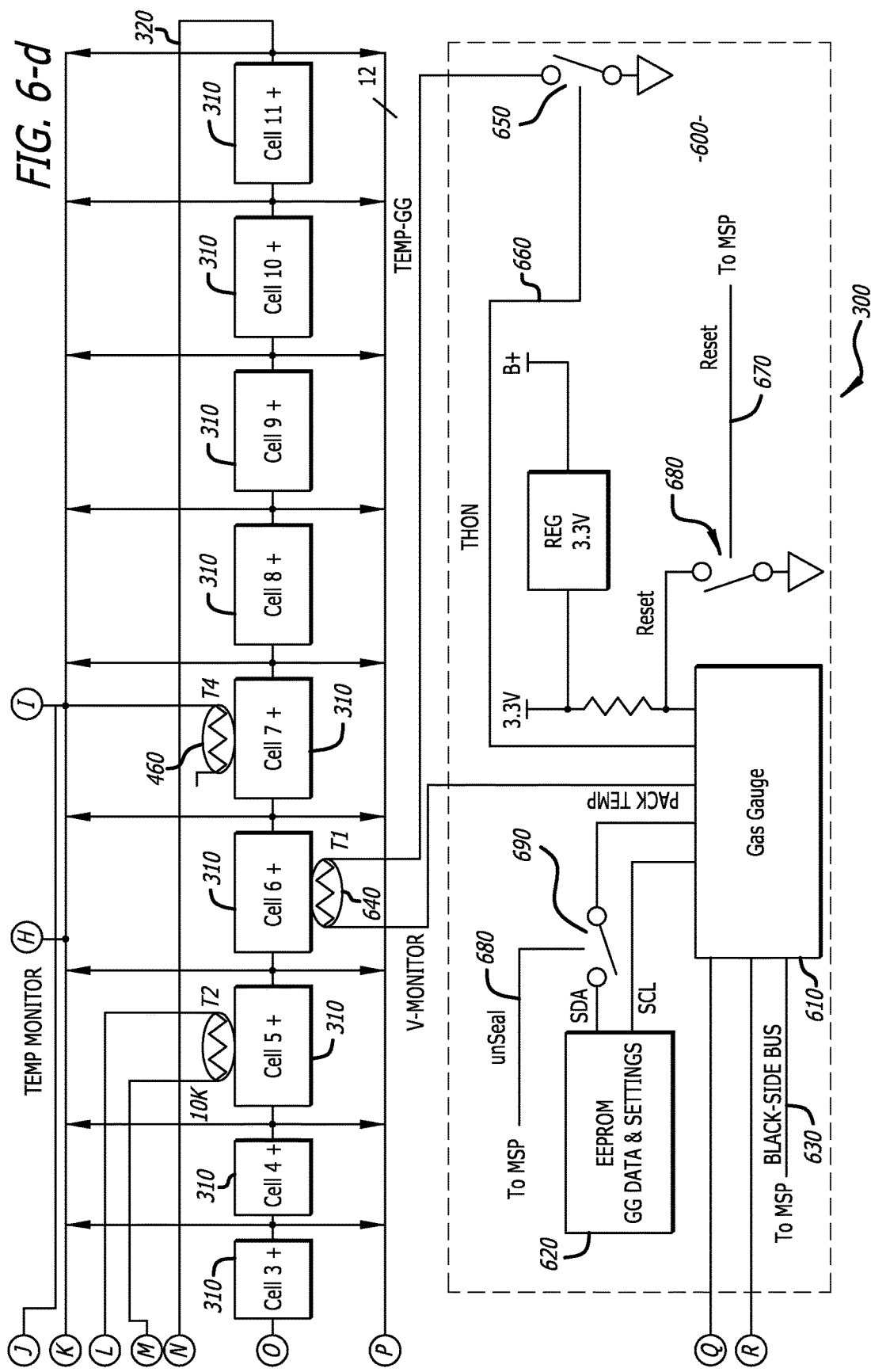
FIG. 6-d

SYSTEM AND METHOD FOR AUTOMATED DETECTION OF BATTERY INSERT

CROSS-REFERENCES TO RELATED APPLICATIONS

This application claims the benefit of priority to U.S. Provisonal Application No. 61/522,203, filed Aug. 10, 2011 and U.S. Provisional Application No. 61/480,286, filed Apr. 28, 2011.

FIELD OF THE INVENTION

The invention is directed to a battery pack for providing power to a device. More specifically, the invention is directed a battery pack and battery management system for managing the charging and discharging of the battery pack so as to maximize the amount of power available from the device when in use and to recharge the battery in a manner as to prolong the useable life of the battery.

BACKGROUND OF THE INVENTION

Cardiopulmonary resuscitation (CPR) is a well-known and valuable method of first aid used to resuscitate people who have suffered from cardiac arrest. CPR requires repetitive chest compressions to squeeze the heart and the thoracic cavity to pump blood through the body. Artificial respiration, such as mouth-to-mouth breathing or a bag mask apparatus, is used to supply air to the lungs. When a first aid provider performs manual chest compression effectively, blood flow in the body is about 25% to 30% of normal blood flow. However, even experienced paramedics cannot maintain adequate chest compressions for more than a few minutes. Hightower, et al., Decay In Quality Of Chest Compressions Over Time, 26 Ann. Emerg. Med. 300 (September 1995). Thus, CPR is not often successful at sustaining or reviving the patient. Nevertheless, if chest compressions could be adequately maintained, then cardiac arrest victims could be sustained for extended periods of time. Occasional reports of extended CPR efforts (45 to 90 minutes) have been reported, with the victims eventually being saved by coronary bypass surgery. See Tovar, et al., Successful Myocardial Revascularization and Neurologic Recovery, 22 Texas Heart J. 271 (1995).

In efforts to provide better blood flow and increase the effectiveness of bystander resuscitation efforts, various mechanical devices have been proposed for performing CPR. In one variation of such devices, a belt is placed around the patient's chest and an automatic chest compression device tightens the belt to effect chest compressions. Our own patents, Mollenauer et al., Resuscitation device having a motor driven belt to constrict/compress the chest, U.S. Pat. No. 6,142,962 (Nov. 7, 2000); Bystrom et al., Resuscitation and alert system, U.S. Pat. No. 6,090,056 (Jul. 18, 2000); Sherman et al., Modular CPR assist device, U.S. Pat. No. 6,066,106 (May 23, 2000); and Sherman et al., Modular CPR assist device, U.S. Pat. No. 6,398,745 (Jun. 4, 2002); and our application Ser. No. 09/866,377 filed on May 25, 2001, our application Ser. No. 10/192,771, filed Jul. 10, 2002 and our application Ser. No. 12/726,262, filed Mar. 17, 2010 show chest compression devices that compress a patient's chest with a belt. Each of these patents or applications is hereby incorporated by reference in their entireties.

Since seconds count during an emergency, any CPR device should be easy to use and facilitate rapid deployment of the device on the patient. Our own devices are easy to deploy quickly and may significantly increase the patient's chances of survival.

One important aspect of such devices is the need for small, powerful yet reliable power supply to power the device. It is not uncommon for CPR to be administered for at least thirty minutes. Thus, the power supply must be capable of delivering sufficient energy to the motor driving the compression device for at least that length of time. Moreover, the power supply must be relatively light weight, so as to enhance portability of the chest compression device, yet it must deliver its power for an extended period of time without significant voltage or current drop off to ensure consistency of compression throughout the treatment period.

Various approaches to providing the type of high current power cell battery needed to power a mechanical compression device have been designed. As more efficient battery designs and chemistries have been used, the need to carefully manage the charging and discharging of the battery has arisen. To meet this need, complex battery management circuitry has been designed, including the use of processors, memory, and other components. All of these components need to fit within the confines of the battery casing designed for use in a piece of equipment to be powered.

To prevent inadvertent shorting of the battery terminals, one approach that has shown promise is to electrically isolate the battery cells from the terminals unless the battery is properly inserted into a device to be powered, a charger, or other authorized device. Such isolation requires the use of some type of switch which may be controlled by the battery management software and hardware.

What has been needed, and heretofore unavailable, is a light weight, reliable battery pack capable of delivering high current output to power, for example, a medical device. Such a battery should also include a mechanism and/or circuitry to prevent rapid high current discharge of the battery in the event of accidental shorting of the battery terminals. The present invention satisfies these, and other needs.

SUMMARY OF THE INVENTION

In a most general aspect, the invention provides a high-performance battery pack capable of reliably providing high power and current to power a device for a prolonged period of time. Moreover, the battery pack includes a battery management system that monitors and controls all aspects of battery operation, including charging and discharging of the battery. The battery management system is also capable of recording events that occur during charging and discharging of the battery pack, and communicating those events for later analysis. The battery management system is also capable of being updated with enhanced or improved operating parameters, and is capable of managing various battery chemistries to provide for forward and backwards compatibility.

In one aspect, the battery management system of the present invention includes a circuit that prevents current or voltage from flowing to the power supply terminals of a battery unless the battery is properly inserted into equipment that is designed to accept the battery, such, for example, devices intended to be powered by the battery, battery chargers, and the like. In such an aspect, the battery management system is configured using appropriate programming commands to monitor a selected pin on a connector of the battery, and, in response to detection of a selected condition, enable the flow of current through the power terminals of the battery.

In another aspect, the present invention includes a battery connection detection circuit, comprising: a first reference voltage source and a second reference voltage source; a detection line driven high by the first reference voltage source; a comparison circuit for comparing a signal from the second voltage source to a signal on the detection line, wherein an output for the comparison circuit goes low when the signal on the detection line goes low.

In still another aspect, the present invention includes a rechargeable battery for use in a medical device, comprising: a battery pack having at least one battery cell; a connector disposed on the battery pack, the connector having a positive terminal and a negative terminal in electrical communication with a positive side and a negative side of the at least one battery cell respectively, the connector also have a detection terminal configured to engage a corresponding terminal in a device to be powered by the battery pack; a switch disposed between the positive side of the at least one battery cell and the positive terminal of the connector; a battery management processor in electrical communication with the battery cell and the switch means; a battery detection circuit in electrical communication with the detection terminal, the battery detection circuit configured to provide a battery detection signal to the battery management processor when the battery pack is inserted into a device configured to accept the battery pack; and wherein the battery management processor provides a signal to the switch means to control the switch means in response to the battery detection signal to allow current to flow through the switch means from the positive side of the at least one battery cell to the positive terminal of the connector.

In yet another aspect, the at least one battery cell is based on Lithium-Ion chemistry. In still another alternative aspect, the switch is a n-FET MOSFET device.

In another alternative aspect, an output of the battery detection circuit is biased high when the battery pack is not inserted into the device configured to accept the battery pack. In yet another alternative aspect, insertion of the battery pack into the device configured to accept the battery pack drives the output of the battery detection circuit low. In still another aspect, the battery detection signal has an edge that serves as an interrupt when the edge is received by the battery management processor, and in yet another aspect, the edge is a falling edge formed as the detection signal drops from a high condition to a low condition.

In a still further aspect, the detection signal drops from the high condition to the low condition when the detection terminal of the connector engages the corresponding terminal in the device configured to accept the battery pack.

In yet another aspect, the corresponding terminal in the device configured to accept the battery pack is connected to ground.

In another aspect, the battery management processor receives the interrupt and analyzes the detection signal to determine whether the signal has a high condition or a low condition. In an alternative aspect, the battery management processor provides a signal to the switch to allow current to flow through the switch if the detection signal has the low condition.

In still another aspect, the battery detection circuit includes a detection line biased with a first voltage and a reference line biased with a second voltage, and also having a comparison circuit for comparing the first voltage to the second voltage, the comparison circuit having an output having a first condition when the first voltage is greater than the second voltage and a second condition when the first voltage is less than the second voltage. In an alternative aspect, the second condition indicates that the battery pack has been inserted into the device configured to accept the battery pack, and in another alternative aspect, the comparison circuit includes an operational amplifier configured as a comparator.

In yet another aspect, the battery detection circuit includes static electricity protection means.

In still another aspect, the switch is a mechanical switch or interlock.

In a further aspect, the battery management processor is configured to provide a handshaking signal through the connector to the device to be powered. In a still further aspect, the handshaking signal is encrypted.

Other features and advantages of the invention will become apparent from the following detailed description, taken in conjunction with the accompanying drawings, which illustrate, by way of example, the features of the invention.

BRIEF DESCRIPTION OF THE DRAWINGS

FIG. 6 is a schematic diagram of an embodiment of battery management system in accordance with principles of the present invention.

DETAILED DESCRIPTION OF THE PREFERRED EMBODIMENTS

Figure 1:
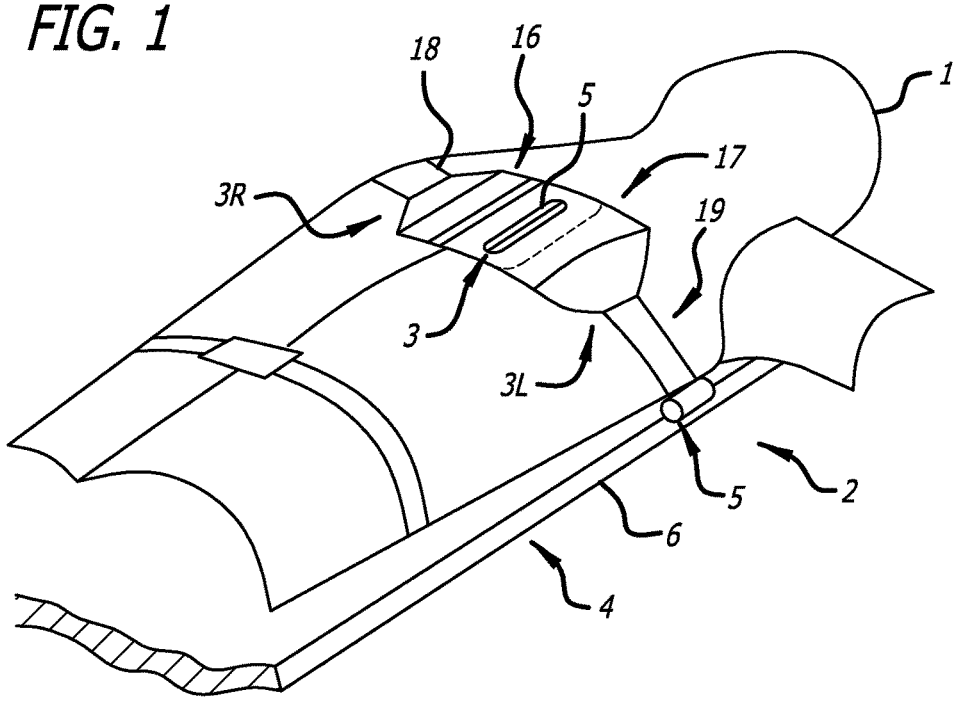
FIG. 1 illustrates a method of performing chest compressions on a patient by using a mechanical chest compression device.

The various embodiments of the present invention are directed to providing a rechargeable battery for powering mobile equipment, particularly medical devices. The embodiments of the invention are particularly advantageous when the battery is required to provide a large amount of current over a predictable period of time. Moreover, the embodiments of the invention include a battery management system that controls all aspects of the operation of the battery, and also includes a memory in which events related to the battery that occur during the battery's lifetime are stored. Moreover, embodiments of the battery management system include the capability of accommodating batteries using different battery chemistries, and are also capable of being updated through a communication port.

While the various embodiments of the invention are described with reference to a mechanical compressions device, those skilled in the art will immediately appreciate that those embodiments are not to be limited to powering such a device. Indeed, such a use is merely exemplary, and a battery in accordance with the various embodiments of the present invention may be used to power any device, and in particular, medical devices, wherein the design requirements of the device are met by the capabilities of such a battery.

When a battery in accordance with the various embodiments of the present invention is used with a mechanical compression device, the battery must be capable of powering the mechanical compression device for long enough to treat the patient not only in the field, but also during transport of the patient from the field to a care center. Experience has shown, however, that a patient's size and weight are factors that determine the amount of current drain on the battery during treatment. Accordingly, treatment of a larger than average patient results in a larger current draw on the battery.

For example, studies have found that the chest depth, chest breadth and chest circumference are factors influencing the amount of current drain on a battery powering a mechanical compression device. Other studies have observed that the mean chest depth of an average adult human male is 9.4 inches, mean chest breadth is 12.2 inches and mean chest circumference is 39.7 inches. See, Young, J W, R F Chandler, C C Snow, K M Robinette, G F Zehner, M S Lofberg, Anthropometric and Mass Distribution Characteristics of the Adult Female, FAA Civil Aeromedical Institute, Oklahoma City, Okla., Report No. FAA-AM-83-16, 1983; Anthropometry and Mass Distribution for Human Analogues: Volume 1: Military Male Aviators, Report No. USAFSAM-TR-88-6, March, 1988; Haslegrave, C M, "Characterizing the anthropometric extremes of the population", *Ergonomics,* 29:2, pp. 281-301, 1986; Diffrient, N, A R Tilley, J C Bardagy, *Human Scale* 1/2/3, The MIT Press, Cambridge, Mass., 1974; and *PeopleSize Pro* Software, Open Ergonomics Ltd., 34 Bakewell Road, Loughborough, Leicestershire, LE11 5QY, United Kingdom, the entireties of which are hereby incorporated by reference herein. A battery that can sustain operation of the mechanical compression device for at least thirty minutes for an average size patient, and at least twenty minutes for a larger than average size patient is advantageous.

Referring now to the drawings in detail, in which like reference numerals indicate like or corresponding elements among the several figures, there is shown in FIG. 1 a chest compression belt fitted on a patient 1. A chest compression device 2 applies compressions with the belt 3, which has a right belt portion 3R and a left belt portion 3L. The chest compression device 2 includes a belt drive platform 4 and a compression belt cartridge 5 (which includes the belt). The belt drive platform includes a housing 6 upon which the patient rests, a means for tightening the belt, a processor and a user interface disposed on the housing. The belt includes pull straps 18 and 19 and wide load distribution sections 16 and 17 at the ends of the belt. The means for tightening the belt includes a motor attached to a drive spool, around which the belt spools and tightens during use. The design of the chest compression device, as shown herein, allows for a lightweight electro-mechanical chest compression device. The fully assembled chest compression device weighs only 29 pounds, and is thus hand-portable over long distances. The device itself weighs about 22.0 to 23.0 pounds, with the battery, in at least one embodiment of the present invention, weighing between 2 and 5.0 pounds, and preferably about 3 pounds. The belt cartridge weighs about 0.8 pounds and the straps to secure the patient weigh about 1.6 pounds.

Figure 2:
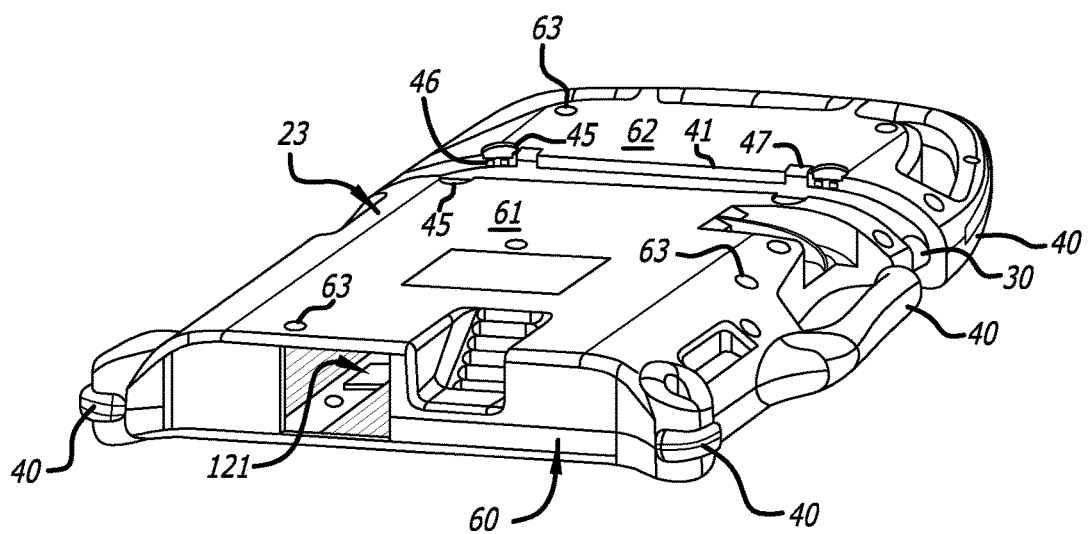
FIG. 2 is perspective view of the mechanical chest compression device of FIG. 1 showing the bottom and front sides of the device

FIG. 2 shows the posterior side 23 of the chest compression device as seen from the superior direction. In the perspective of FIG. 2, the average sized patient's buttocks and the back of the patient's legs would extend past the inferior bumper 40. The device is built around a sturdy channel beam 41 that is laterally oriented with respect to the housing. The channel beam supports the device against the forces created during compressions. The channel beam also serves as the structure to which the belt cartridge is attached.

The channel beam 41 forms a channel extending across the lateral width of the device. During compressions, the belt is disposed in and travels along the channel. The belt is attached to a drive spool 42 that spans the channel.

Figure 3:
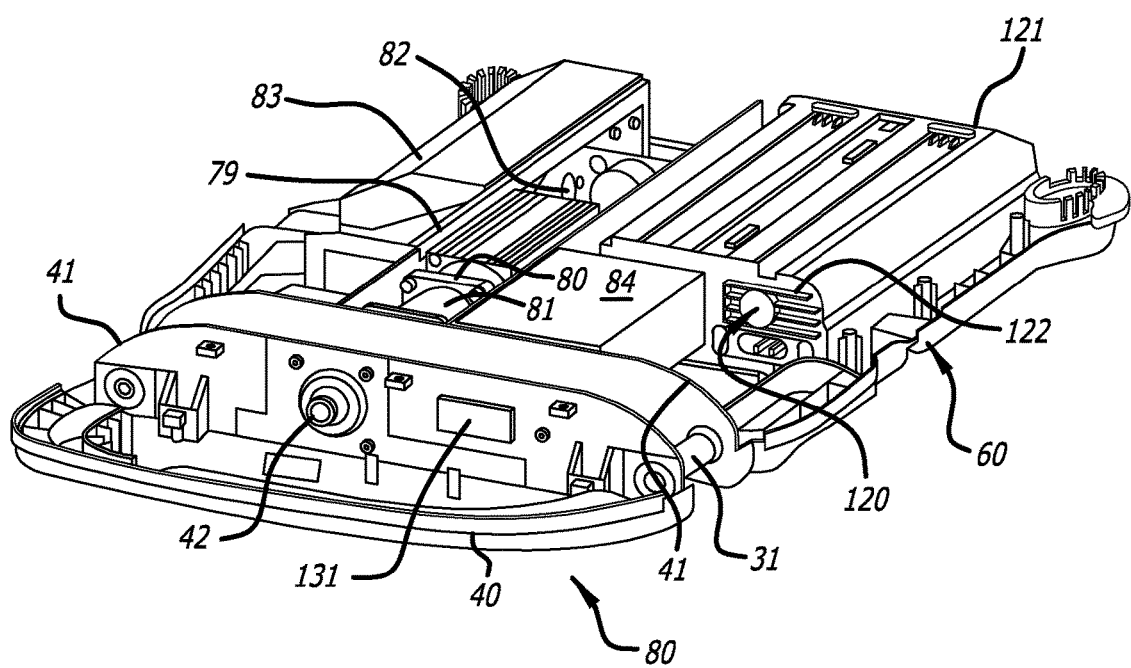
FIG. 3 is a perspective view of the mechanical chest compression device of FIG. 1 showing the bottom and rear cover plates removed.

FIG. 3 shows internal components of the chest compression device 2. A motor 79 is operable to provide torque to the drive spool 42 through a clutch 80 and a gearbox 81. A brake 82, attached to the superior side of the motor, is operable to brake the motion of the drive spool. The brake hub connects directly to the rotor shaft of the motor.

The motor 79 and brake 82 are controlled by a processor unit 83, motor controller 84 and power distribution controller, all of which are mounted to the inside of the anterior cover plate 60. The processor unit includes a computer processor, a non-volatile memory device and a display.

The processor unit is provided with software used to control the power controller and the motor controller. Together, the processor unit, power controller and motor controller make up a control system capable of precisely controlling the operation of the motor. Thus, the timing and force of compressions are automatically and precisely controlled for patients of varying sizes.

FIGS. 2 and 3 also show the location of a battery compartment 121 near the head of the patient. The location and design of the battery pack and battery compartment allow for rapid exchange of batteries. A spring in the back of the compartment forces the battery pack out unless the battery pack is fully and correctly inserted in the compartment. A latch on one end of the battery pack engages a receiver in the battery compartment 121 to hold the battery pack within the batter compartment when the battery pack is inserted into the battery compartment. Recesses 120 indicate the location of the springs inside the battery compartment 121. Plastic grills 122 at the end of the battery compartment reinforce the recesses.

Figure 4A:
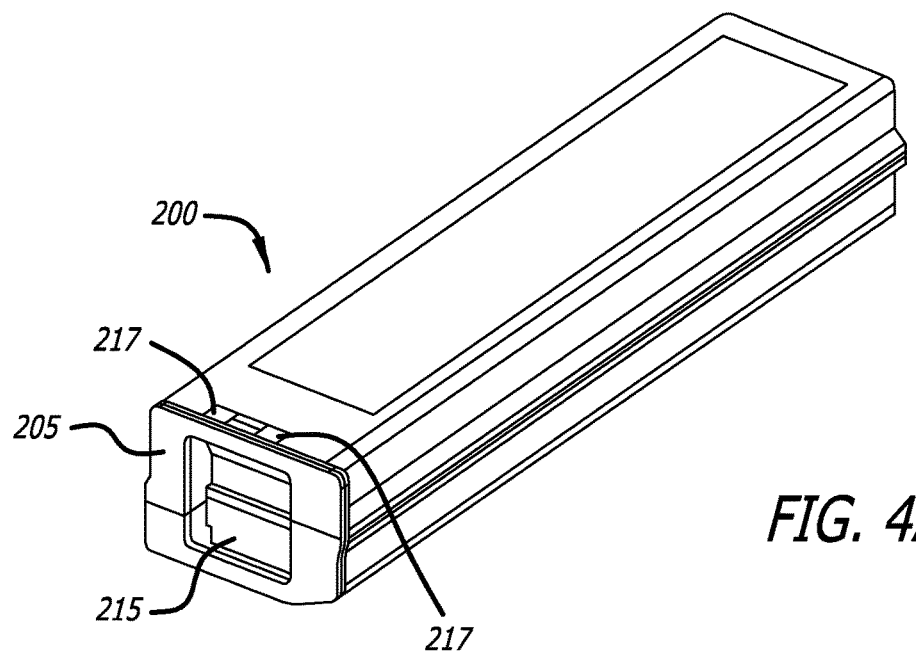
FIG. 4A is perspective view of a battery pack in accordance with the present invention showing a battery latch disposed on a front side of the battery pack.
Figure 4B:
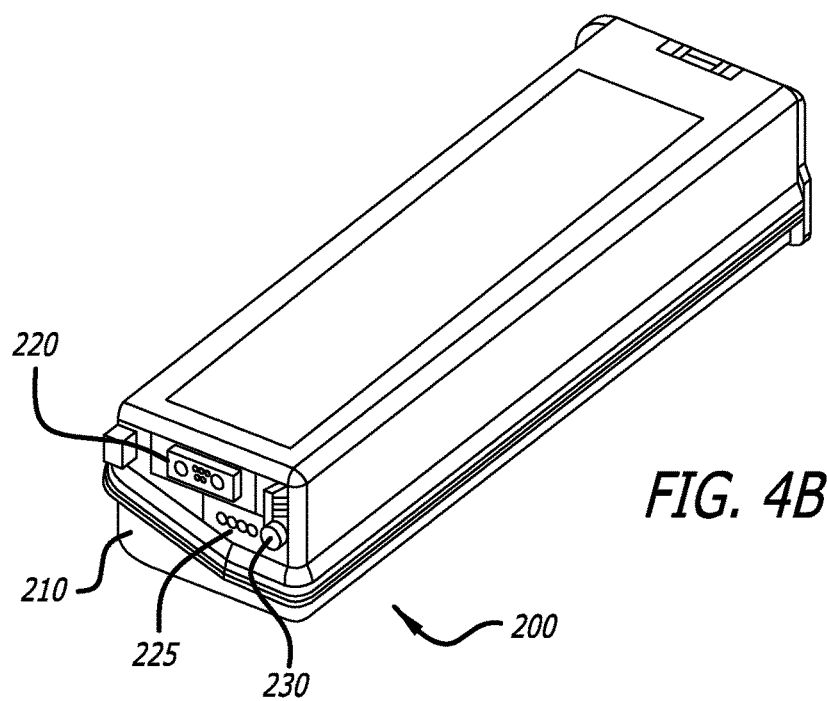
FIG. 4B is a perspective view of the battery pack of FIG. 4A showing a connector, indicator and button disposed on a back side of the battery pack.

FIGS. 4A and 4B are perspective views of a battery pack 200 showing the front and back sides 205, 210 of the battery pack respectively. Front side 205 of the battery pack faces outward and is visible to the user when the battery pack is inserted into the battery compartment 121 (FIG. 3). As shown in FIG. 4A, front side 205 includes a latch 215 that engages a receiver within battery compartment 121 to hold the battery pack 200 within the battery compartment. Also shown in FIG. 4A are a pair of raised tabs 217 disposed on the tops side of the front end of the battery pack. These tabs cooperate with the latch to ensure that the battery is properly seated in the battery compartment by prevent the top of the battery from riding up during battery insertion, forcing the latch into proper engagement with a battery latch receiver or lip of the battery compartment.

The back side 210 of the battery pack, as seen in FIG. 4B, includes a connection 220 that connects to a connector within battery compartment 121 to enable electrical communication between the controller or processor of the mechanical compression device and the battery pack 200. This connector not only allows for the flow of current from the battery pack to power the mechanical compression device, but it also provides for the flow of data, programming commands and other information, such as battery charge status, discharge rate, time remaining until discharged, and the like between the battery pack and the processor or computer controlling the operation of the mechanical compression device. Similarly, connector 220 may be configured to be connected to a connector in a battery charger to charge the cells of the battery pack, as well as to provide for the flow of data, software programs or commands and/or other information between the charger and the battery pack. It is also contemplated that connector 220 may be used to connect the battery pack to a communication network that would allow for flow of information between the battery pack and other computers, servers, processor or devices that are also connected to the network. It will be understood that the network may be a wired network, such as, for example, an Ethernet, or it may be a wireless network. The network may be a local network, or it may be a wide area network, such as a WLAN or the Internet.

A status indicator 225, which may be, for example, one or more light emitting diodes (LEDs) or similar devices, is also disposed on the back end 210 of battery pack 200 to provide a visual indication of, for example, the charge/discharge status of the battery pack, the presence of any faults that would affect the operation of the battery pack, or other information that might be useful to the user of the battery. A push button 230 is also included; button 230 may be used, for example, to initiate a reset of the battery pack. Alternatively, button 230 may be used to initiate a diagnostic test, the results of which may be indicated by status indicator 225. In other embodiments, pressing button 230 may initiate other functions of the processor in the battery pack, including, for example, and not by way of limitation, determining the remaining capacity of the battery, display of fault codes through the use of status indicator 225 and the like.

Figure 5:
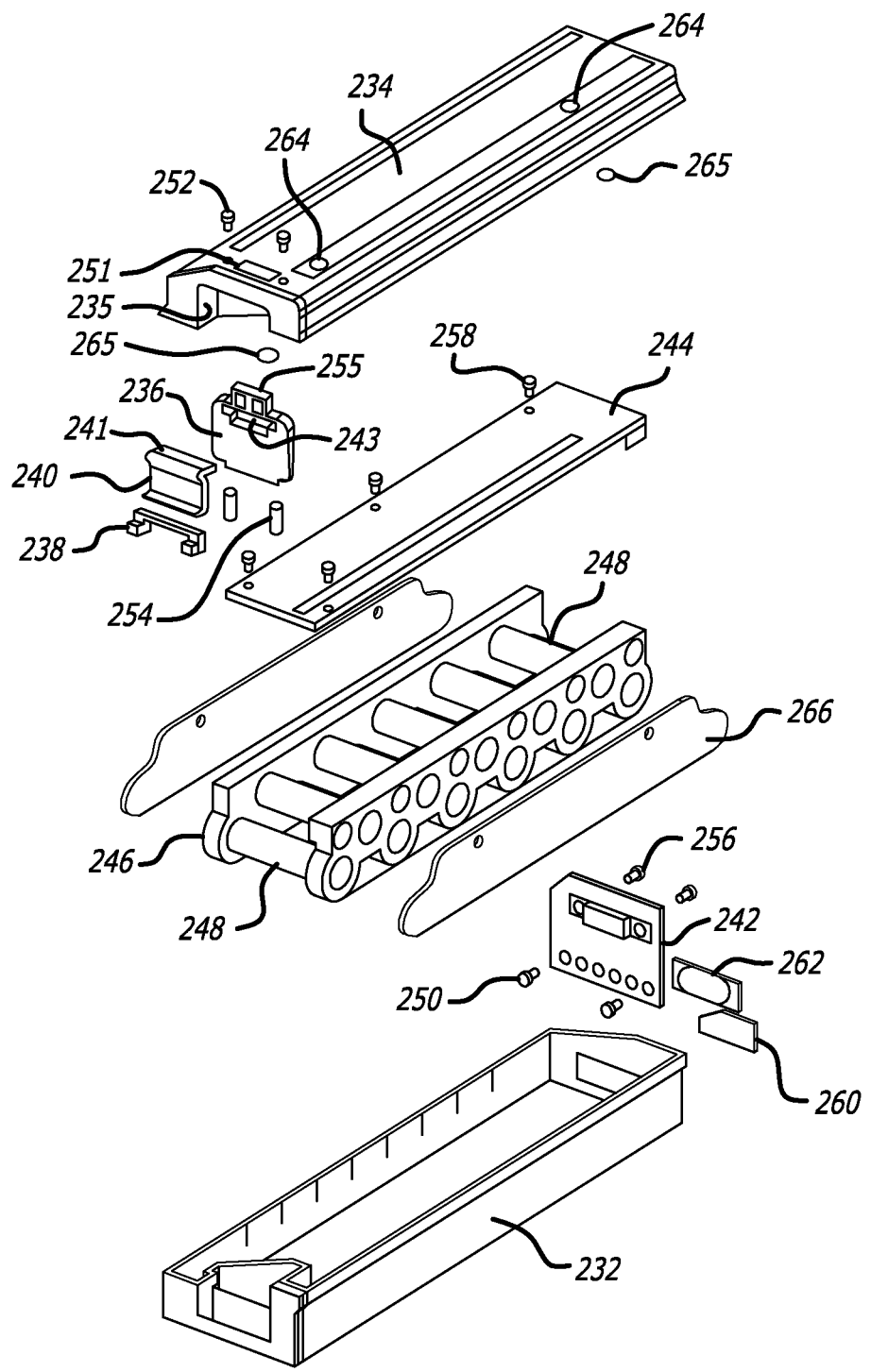
FIG. 5 is an exploded perspective view illustrating various components of one embodiment of a battery pack of the present invention.

FIG. 5 is an exploded perspective view of the battery pack 200. The battery pack 200 in this exploded view has been inverted from the view of FIGS. 4A and 4B. The battery pack has a bottom enclosure 234 and a top enclosure 232. A battery latch assembly having a battery latch 236, a lever base 238 and a lever latch 240 is mounted at the side of the battery pack facing outward when the battery pack is inserted into a battery compartment, and is held in place by the bottom and top enclosures. Lever latch 240 has a wing 241 that is inserted into a groove or slot 243 formed in a face of battery latch 236, and lever base 238 is mounted on the bottom enclosure to pivotally hold lever latch 240 in the enclosure. Compression springs 254 are disposed between a bottom end of battery latch 236 and top enclosure 232. A projection 255 is disposed a top end of battery latch 238, and is configured to protrude through slot 251 that extends through a thickness of the bottom enclosure 234. In this manner, battery latch 236 may be manipulated by a user to engage and disengage projection 255 from the latch receiver located in the mechanical compression device to insert the battery pack into the battery compartment and to release the battery pack for removal from battery compartment 121.

Disposed at the back end 210 of the battery pack is a battery entry board 242 to which is mounted connector 220, indicator 225 and button 230 (FIG. 4B). Entry board 256 is mounted to bottom enclosure 232 using one or more screws 250. The entry board may also be fastened to top enclosure 252 using one or more screws 256. In some embodiments, a water resistant gasket 262 may be used to resist the incursion of fluids into the interior of the battery pack. Moreover, a label 260 may be used to provide information to a user relative to the various indications that may be provided by indicator(s) 225.

A battery management board 244 to which is mounted processors, memory and electrical circuitry for managing the various operations of the battery (which is described in more detail below) is mounted using screws or other fasteners 258 to battery cell assembly 246. Battery cell assembly 246 includes one or more battery cells 248. Battery cells 248 may be cells utilizing a variety of battery chemistries, such as, for example, nickel metal hydride, lithium hydride, lithium-ion and the like. Battery management board 244 and battery cell assembly 246 may also include a pair of splatter shields 266 mounted on left and right sides of battery cell assembly 246 to protect the terminals of the individual battery cells 248 from inadvertent contact with other parts of the assembly, thus providing a shield against short circuit of the battery cells.

Battery pack 200 also includes at least one vent 264, shown disposed in the top enclosure to allow for venting of the battery pack to prevent buildup of potentially flammable or explosive gases produced by the battery cells 248 during charging or discharging of the battery pack. While shown disposed in the top enclosure, those skilled in the art will appreciate that the vents may be disposed through any wall or side of the battery pack. Vents 264 may be a simple hole extending through the wall or side of the battery pack. Alternatively, vent 264 may include a filtering means 265, such as a screen or hydrophobic membrane to prevent the incursion of particulates or fluids or moisture into the interior of the battery pack. An additional advantage of such vents is that the vent or vents provide for equalization of pressure between the interior and exterior of the battery pack, such as may occur when the battery pack is transported to a higher or lower altitude.

The mechanical compression device described above requires a reliable power source to operate. It is not unusual for the device to be required to be used for thirty minutes or more to provide resuscitation to a patient in an emergency. The torque and power requirements of the motor of the mechanical compression device require up to a peak of seventy amperes of current during compression. If enough current cannot be delivered by the battery to the motor controlling the compressions, the voltage falls off and the motor may not be capable of generating enough torque to ensure complete compression of a patient's chest.

The inventors of the present invention have realized that having a very low total internal resistance is key to ensuring extended and reliable operation of the battery when the battery is under a constant power drain. One such battery chemistry that has been found to be useful in devices requiring high power is a battery using Lithium Ion chemistry, such as the model ANR26650M1-A or ANR26650M1-B Lithium Ion cell available from A123 Systems, Incorporated.

FIG. 6 is a schematic diagram illustrating one embodiment of a battery pack 300 in accordance with the present invention. Battery pack 300 includes eleven Li-Ion chemistry cells, such as the model ANR26650M1-A or ANR26650M1-B cells described above. Each cell provides 3.3 volts, and the eleven cells are connected in series to provide a total of 36.3 volts. Using such cells, one embodiment of a battery pack in accordance with principles of the present invention can be manufactured that weighs approximately three pounds. Such a battery has been observed to deliver between 1550 and 2000 watts, and preferably deliver a peak power of 1800 watts. This provides a desirable weight to power ratio. Moreover, such an embodiment has also been found to be able to deliver energy of slightly less than 100 watt/hours. While eleven battery cells are used in this exemplary embodiment, more or less cells could be used depending on the requirements of the device to be powered.

To provide the amount of current required to operate the motor of the compression device, the inventors have discovered that it is important to minimize the internal resistance of the battery pack. Accordingly, the Lithium Ion (Li-Ion) cells used should have low internal DC resistance, preferably below 15 milliohms, and more preferably below 12.5 milliohms per cell.

While Li-Ion batteries are capable of providing the voltage and current required to operate a mechanical compression device for extended periods of time, care must be taken during both the discharge phase, and recharge of the batteries to ensure that the batteries continue to function for their desired lifetimes. It is well known that Li-Ion cells should not be over charged, nor should they be over discharged. Accordingly, various embodiments of the present invention include the capability of monitoring and controlling both the discharge of the cells and the recharging cycle. Those embodiments will be discussed in more detail below.

As described previously, the eleven Li-Ion cells 310 are connected in series by a main power bus 320. Bus 320 has both a positive side and a negative, or ground side, as is typical for a DC circuit. Bus 320 delivers the direct current provided by the battery cells to a load (in this example, the mechanical compression device) through an interface 330. As shown in FIG. 6, interface 330 is a pin connector having seven connection pins. Alternatively, a socket could be used, or a combination of pins and sockets, with more or less than seven pins or sockets could be used.

The positive side of bus 320 is connected to pin 7 of interface 330. Similarly, the negative side of bus 320 is connected to pin 6 of interface 330. Pins 1-5 of interface are used to communicate various signals involved in the monitoring and control of the battery pack, as well as for communication to the device that is being powered, enabling the exchange of information and control signals between the battery pack and the powered device. Various exemplary embodiments of the invention incorporating those features will be discussed in more detail below.

Returning again to FIG. 6, the positive side of bus 320 includes a fuse 342 to protect the circuit from over current conditions. Fuse 342 may be, for example, a 30 ampere fuse. In such a case, a sustained current flow through fuse 342 of more than 30 amperes would cause the fuse to open, breaking the circuit created by bus 320 and stopping the flow of current from the battery cells. While not shown, there is also a blown fuse detector circuit that monitors the fuse, and, if the fuse is blown, provides a signal to the pack controller that the fuse is blown. The pack controller may then provide a signal indicating that the battery is not suitable for use. Such a signal, for example, may be the change in color of and LED, or activation or de-activation of some other status indicator. Alternatively, the pack control may provide a signal to the equipment powered by the battery, which may then provide an indication to a user that the battery is not ready for use.

The positive side of main bus 320 also includes a number of n-channel field effect transistors (n-FET) 340, 350 and 360. These n-FETs provide for switching and control of the circuit. N-FETs are used because they provide a very low resistance switch in keeping with the design requirement of minimizing the total internal resistance of the battery. Another unique capability of the n-FET is that they are capable of conducting high current loads, without damage and without generating excessive amounts of heat. One example of an n-FET that has been found suitable for use in various embodiments of the present invention is the model IRLS3036, available from Digi-Key Corporation.

In typical designs, p-FET devices would be used as the switches and would be placed in the high side of the main bus. However, p-FETS have two or more times the on resistance of an n-FET device. Thus, to handle the same current as an n-FET device, several p-FETs wired in parallel would be needed. Moreover, use of several p-FETS may also require the use of a heat sink to dissipate heat generated while the p-FET is on. This is disadvantageous where space within the battery pack is limited.

Similarly, an n-FET device would typically be used in the low side of the main bus to switch the current on and off in the bus. However, use of an n-FET in this situation breaks the ground of the battery, which may cause noise in the circuit and interfere with communication between the various elements of the battery management system circuitry. Accordingly, the inventions have placed the n-FET switches in the high side of the bus, which provides efficient switching of the bus without the generation of excess heat that may occur when p-FETs are used. Placing the n-FETs in the high side of the bus also eliminates the problem of breaking the ground of circuit.

In some embodiments, one or more resistors, such as resistors 370 and 380, may be inserted in the negative, or low, side of the main bus circuit. These resistors provide the ability to tap the main bus to monitor various aspects of the current flowing through the circuit. For example, in one embodiment, resistor 370 is connected across the input lines of a cell balancing and primary protection circuit, which is discussed in more detail below. A typical value for resistor 370 is, for example, 2.5 milliohms.

In another embodiment, resistor 380 may be connected across a state-of-charge monitor, also known as a "gas gauge." In this embodiment, the value of resistor 380 may be, for example, 5 milliohms.

Each of the cells 310 is individually monitored during both charging and discharging to control the rate of charging and discharging, respectively. In one exemplary embodiment, as shown in FIG. 6, a separate cell tap line 390 is connected to each cell and to a cell monitoring and balancing circuit 400.

Primary Protection

During charging, the voltage of each cell is independently monitored to prevent overcharging of the cell. In one exemplary embodiment, a monitoring system on a microchip, which may be, for example, battery pack protection and monitor integrated circuit (IC) 410 such as an OZ890 available from O$_2$ Micro, is used to control the charging of the various cells. In such an arrangement, cell monitoring line 390 provides a positive signal to a representative pin input of IC 410. For example, cell 1 is monitored using input line BC1 of IC 410, and so forth up to cell 11, which is monitored using input line BC11 of IC 410.

If the control circuitry of IC 410 detects an imbalance in a cell, IC 410 provides a signal on an appropriate external bleed control line CB1-CB11. As shown in FIG. 6, when the signal on the appropriate external bleed control line is applied to the gate of n-FET 420, current is allowed to pass between the source and the drain of n-FET 420 and then through resistor 430, which results in bypassing the cell and halting charging of the cell. As can be seen from FIG. 6, each cell has its own dedicated combination of resistor and n-FET in electrical communication with IC 410 for monitoring each cell and preventing each individual cell from over charging.

Cell balancing and primary protection IC 410 may also be used in some embodiments to monitor the total voltage of the battery cell pack. For example, when all of the cells have attained their maximum voltage, IC 410 can send a low signal to the gate of n-FET 350 to open the channel between the source an drain of n-FET 350 and thus open the main bus circuit 320. This results in a cessation of charging current through the cells, and thus halts the charging process.

Similarly, IC 410 monitors the voltage across the cells during discharge of the battery. When the voltage across the cells drops below a threshold level, for example, 21 volts, IC 410 drives the signal on line 450 low, which in turn shuts off n-FET 360 which interrupts the main bus circuit. This prevents damage to the battery cells that may be caused by removing too much of the charge in the cells, which may result in decreased life of the cell.

IC 410 may also include and control a temperature measurement capability designed to monitor the temperature of the battery pack and/or individual battery cells to prevent overheating. In this embodiment, one or more thermistors 460 are used to provide temperature signals over line 470 to the IC 410. If IC 410 determines that the temperature of the battery is either too high or too low, IC 410 may drive either or both of n-FETs 350 and 360 low, opening the main bus 320 and isolating the battery pack. It will be understood that while only a single line 470 is shown for clarity, line 470 includes an appropriate number of conductors to monitor the function of all thermistors used in the temperature monitoring circuit in communication with IC 410.

IC 410 may additionally provide a visual indication of fault state by providing a fault signal on line 480 that may then be used to cause LED 490 to light up. This visual signal of a fault condition sensed by the primary protection circuit indicates that the battery pack has been rendered non-functional by IC 410 and that repair or maintenance of the battery pack may be required.

Secondary Protection

Some embodiments of the present invention may also include secondary protection against catastrophic faults or over voltage protection. Such secondary protection may be provided by a variety of circuits designed to monitor the voltage of the battery pack and/or the current flow through the main bus and to take action when certain thresholds values of current or voltage are exceeded. In one embodiment, such protection may be provided by an integrated circuit 500, such as, for example, the OZ8800 available from O$_2$Micro. Those skilled in the art will know that, depending on the number of cells used in the battery pack, more than one IC 500 may be required. For example, the OZ8800 secondary level battery protection integrated circuit can monitor three to seven individual cells. Thus, where eleven cells are used, two OZ8800s will be required.

IC 500 monitors the voltage of each cell over monitoring line 312. In some embodiments, a time delay may be employed that provides for temporary over voltage conditions to exist. Where the time threshold is exceeded because the voltage did not drop back into an acceptable range, IC 500 sends a low signal over fault line 510 to n-FET 340 to turn off n-FET 340. Each cell is monitored by a similar circuit.

It should be apparent from FIG. 6 that the n-FETs described above are in a normally off state unless a positive voltage is applied to the gate of each n-FET. Thus, any fault that results in voltage decrease to a level below the threshold of the n-FET at the gate will cause the n-FET to open, thus providing additional protection to the cells and battery management circuitry.

Gas Gauge

Another embodiment of the present invention includes a "gas gauge" function that monitors the amount of useful charge remaining in the battery pack. Such gas gauge functionality can be provided using integrated circuits designed to carry out vary tasks, such as to calculate remaining battery capacity for use and standby conditions based on time of use, rate of discharge and the temperature of the battery. Such a circuit may also determine the true battery capacity in the course of a discharge cycle from near full charge to near full discharge states.

FIG. 6 illustrates one example of such a gas gauge circuit 600. Monitoring of the battery pack is accomplished using an integrated circuit 610, such as a bq2060A available from Texas Instruments, Inc. IC 610 works in conjunction with an external EEPROM 620. EEPROM 620 stores configuration information for IC 610, such as the chemistry used in the battery cells, the self-discharge rate of the battery, various rate compensation factors, measurement calibration, and battery design voltage and capacity. All of these settings can be changed to allow the system to be used with a variety of battery types. Moreover, IC 610 can communicate with a central processor and memory over a back-side bus circuit 630. In this manner, IC 610 and EEPROM 620 may be configured, using control signals from the central processor, to accommodate different types of batteries that are detected and identified by other circuitry included in the system, or which are manually identified by a user. In an alternative embodiment, IC 610 may also cooperate with the pack controller to augment the reporting accuracy of the gas gauge in instances of low current draw using appropriate control commands embedded into the software that controls the operation of the pack controller and the gas gauge to implement the algorithms necessary to carry out this function.

In general, the gas gauge functions are carried out by IC 610 in conjunction with IC 800 to determines full charge battery capacity and the capacity remaining at any point in time by monitoring the amount of charge input or removed from the battery cells. In addition, IC 610 measures battery voltage, battery temperature and current as detected across resistor 380. IC 610 also, in some embodiments, may estimate the self-discharge rate of the battery, and also monitors for low-voltage thresholds of the battery. As described, IC 610 measures the amount of charge and discharge of the battery by monitoring the voltage across resistor 380, which is located between the negative terminal of the first cell 310 (of the series connected cells) the negative terminal of the battery pack. Available battery charge is determined from this measured voltage and correcting the measurement for environmental and operating conditions.

IC 610 may also measure the temperature of the battery pack so as to carry out the estimations and adjustments described above. In one embodiment, a thermistor 640 is mounted adjacent to a cell or cells of the battery pack in such a manner as to be able to measure the temperature of the cell or cells of the battery pack. IC 610 drives the gate of n-FET 650 high by providing an appropriate signal over line 660 to connect a bias voltage source to thermistor 640 while the temperature of the cell or cells is being measured. Once the measurement is completed, IC 610 drives the gate of n-FET 650 low, opening the n-FET and thus disconnecting thermistor 640 from the bias source.

IC 610 may be reset each time the battery is charged so that the reported amount of charge remaining in the battery is accurate. A battery pack supervisor circuit or pack controller 800, to be described in more detail below, provides a signal over reset line 670 to drive the gate of n-FET 680 high. This causes the current to flow through n-FET 680, resulting in a reset signal being provided to IC 610 to reset the battery capacity counter of IC 610.

In another embodiment, IC 610 may include a seal/unseal function that prevents unauthorized access to the parameters stored in the IC 610 or EEPROM 620. Pack controller 800 may send a signal over line 680 that drives the gate of n-FET 690 high, which closes n-FET 690 allowing for commands and data to flow between IC 610 and EEPROM 630. Such data may include, for example, updated calibration information and the like. In an alternative embodiment, the flow of data between IC 610 and EEPROM 630 may be controlled using only software commands from the pack controller to control IC 610 and EEPROM 630 without requiring n-FET 690.

Pack Controller

In another embodiment of the present invention, the battery management system includes a pack controller 800 which serves as an overall supervisor for the various functions carried out by the battery management system. Pack controller 800 will typically be an integrated circuit, although discrete circuitry carrying out the same functions could be used, depending on the amount of space available within the confines of the battery pack.

For example, pack controller 800 may be a low or ultra-low power microcontroller such as the MSP430F2418 Mixed Signal Controller available from Texas Instruments Incorporated. Such a controller may include memory, such as random access memory or flash memory to provide for rapid and efficient execution of the various functions of the battery management system. Pack controller 800 also has the capability of communicating with peripheral devices, circuitry or memory over one or more communication buses, such as backside bus 630 and front-side 810. The communication busses typically use a communication protocol such as, for example, the I²C bus (a Trademark of Philips Incorporated) or the System Management Bus (SMBus). The SMBus is described in more detail below.

Appropriate software commands are used to program the functions of the pack controller 800. Such software includes commands configuring the communication protocol interface, such as for example, the SMBus interface. The software would also configure the pack controller to monitor critical battery pack parameters, which are made available to it over communication lines 810, 820, 822, back-side bus 630, front side bus 810 and detect line 824, as well as other communications lines not shown or which may be added in the future.

When appropriately programmed, pack controller 800 is also in communication with one or more memory devices, such as, for example, an event archive EEPROM 900. Such an archive has, for example, although not limited to, 64 kilobytes of memory that can be used to store history of various events that occur during the charge and discharge cycles of the battery pack, such as, for examples, the total amount of charge, total amount of energy discharged, the temperature of the battery cells, any faults that occur, or other information related to the individual battery cells and/or the various circuits employed to manage and control the operation of the battery.

Pack controller 800 may also be programmed to communicate with memory and/or processors such as, for example, EEPROM 1000. In the exemplary embodiment shown in FIG. 6, EEPROM 1000 may be located in a mechanical compression device that is powered by the battery pack, or it may be incorporated into the battery pack and configured to be accessed by the devices to be powered by the battery. In this example, pack controller 800 communicates with EEPROM 1000 and/or a processor in the mechanical compression device over front side bus 810, which accesses a similar bus in the mechanical compression device through connector 330. In this manner, a two-way communication connection may be established between the battery pack and a device powered by the battery pack to allow for exchange of information between the battery pack and the powered device. For example, updated operating parameters or commands, including updated software, may be loaded into the battery pack from the powered device when the battery pack is put into communication with the powered device. Similarly, information contained in the event archive EEPROM 900 may be transmitted to the EEPROM 1000, or any other memory (such as a portable memory device) configured for communication over back-side bus 810 from any of the memories present in the battery pack.

It will be understood that this communication capability also allows the battery to communicate with other devices besides devices which will be powered by the battery. For example, typically, the battery pack will be removed from a powered device to be recharged. When the battery pack is connected to a battery charger, the battery charger may be used to retrieve information from the memory or memories of the battery pack, and/or transmit updated data, information, programming commands or software to the battery through front-side bus 810. This communication process will typically be managed using various handshaking and communication dialog as set forth in the communication protocol used to enable the communication, such as the SMBus protocol, exchanged between a processor residing in the charger or other device and the pack controller 800 of the battery pack. In some embodiments, the battery may also be trickle charged when the battery is inserted into the device to be powered, where the device being powered is also connected to an external power supply.

Still other embodiments of the present invention may include a capability, managed by pack controller 800, of recognizing when the battery pack is inserted into a battery charger or device to be powered, such as a mechanical compression device. For example, pack controller 800 may be configured using appropriate software and/or hardware commands to provide a signal to IC 410 and IC 500 to provide a high signal to the gates of n-FETs 340, 350 and 360 to close those switches and thus provide full battery voltage at the positive and negative pins of connector 330 only when detect circuit 1100 sends an appropriate signal to pack controller 800 over line 824 indicating that the battery pack is properly mounted into a device to be powered.

In one embodiment, pack controller 800 monitors a line connected to a mechanical switch or interlock that is forced closed when the battery is properly inserted into a charger or a device to be powered. In another embodiment, pack controller 800 monitors a signal line connected to one or more pins of the battery connector. When an appropriate signal is received over this signal line, pack controller 800 determines that the battery is inserted into a charger or a device to be powered, and provides a high signal to the gates of n-FETs 340, 350 and 360 as described above. This embodiment is particularly advantageous in that pack controller 800 may be programmed to respond only when a particular signal is received, ensuring that the battery is inserted into a specific type or make of a charger or device to be powered designed to accommodate the battery before providing the high signal to the gates of n-FETs 340, 350 and 360.

These embodiments are advantageous in that discharge of the battery in the event of an accidental short circuit across the positive and negative terminals of connector 330 is prevented. Given the amount of energy stored in the cells of the battery pack, such a discharge could be catastrophic. Thus, in this embodiment, there is no voltage between the positive and negative terminals of connector 330 of the battery pack unless the battery pack is properly mounted in a device configured to provide the appropriate signal to the detect circuit 1100, thus providing for safe handling, storage and transport of the battery back when the battery pack is not connected to either a charger or a device to be powered, such as the mechanical compression device described above.

Pack controller 800 may also be programmed to provide password access to allow for changing of settings and parameters stored in EEPROMs 900 and 620, as well as to provide appropriate signals to drive LED 490 in the event of a fault. Additional capabilities may also be included, configured using appropriate software and/or hardware commands, to provide additional functions to the battery management system. For example, such functions may include driving a display that indicates the total amount of charge remaining in the battery and the like. A more complete description of the various capabilities that can be incorporated into pack controller 800, particularly when pack controller 800 is an MSP430F2418 (or other members of this controller family) is contained in a document entitled "MSP430F241x, MSP430F261x Mixed Signal Microcontroller," SLAS541F—June 2007—Revised December 2009 available from Texas Instruments Incorporated, the entirety of which is hereby incorporated herein by reference.

Smart Bus Communications

As will be apparent, the various processors and integrated circuits and logic systems incorporated into the various embodiments of the present invention are capable of functioning as a unified system due to their ability to communicate with one another over the front side bus 320 and the back side bus 630. In some embodiments, the communications over these buses are carried out using the System Management Bus (SMBus) specification. The SMBus is a two-wire interface through which various system component chips, such as IC 410, IC 610, the secondary protection system 500, event archive 900, EEPROM 1000 and pack controller 800, among other circuitry, can communicate with each other and with the rest of the system. Further information related to the SMBus specification is contained in "System Management Bus (SMBus) Specification Version 2.0," SBS Implementers Forum, Aug. 3, 2000, the entirety of which is hereby incorporated herein by reference.

Boost Circuit

The inventors have observed that, in some embodiments of the invention, the voltage required to drive the n-FETs closed exceeds the voltage that is available from the battery pack. For example, using an n-FET that requires a bias voltage of 10 volts, the n-FET requires a drive voltage of the bias voltage plus the battery voltage to drive the n-FET sufficiently to allow an appropriate voltage to pass through the n-FET to charge or discharge the battery. Accordingly, a voltage boost circuit is included to boost the voltage supplied to the gates of the n-FETs to drive the n-FETs to conduct the current supplied by the battery cells.

Those skilled in the art will understand that the use of n-FETs in the present invention results in the need for complex circuitry, such as the boost circuit. Such complexity could be eliminated using p-FETs. Use of p-FETs however, has been found to be disadvantageous because several p-FETs may be needed to handle the same current that can be handled by a single n-FET. Additionally, the heat generated using multiple p-FETs may require the addition of one or more heat sinks to dissipate the heat, which may require more space in a compact battery than which is available. Moreover, it is well known that p-FETs have at least twice the on resistance of n-FETs, which would increase the overall internal resistance of the battery pack.

Device Detection

Still other embodiments of the present invention may include a capability, managed by pack controller 800, of recognizing when the battery pack is inserted into a battery charger or device to be powered, such as a mechanical compression device. For example, pack controller 800 may be configured using appropriate software and/or hardware commands to provide a signal to IC 410 and IC 500 to provide a high signal to the gates of n-FETs 340, 350 and 360 to close those switches and thus provide full battery voltage at the positive and negative pins of connector 330 only when detect circuit 1100 sends an appropriate signal to pack controller 800 over line 824 indicating that the battery pack is properly mounted into a device to be powered.

In one embodiment, pack controller 800 monitors a line connected to a mechanical switch or interlock that is forced closed when the battery is properly inserted into a charger or a device to be powered. In another embodiment, pack controller 800 monitors a signal line connected to one or more pins of the battery connector. When an appropriate signal is received over this signal line, pack controller 800 determines that the battery is inserted into a charger or a device to be powered, and provides a high signal to the gates of n-FETs 340, 350 and 360 as described above. This embodiment is particularly advantageous in that pack controller 800 may be programmed to respond only when a particular signal is received, ensuring that the battery is inserted into a specific type or make of a charger or device to be powered designed to accommodate the battery before providing the high signal to the gates of n-FETs 340, 350 and 360.

These embodiments are advantageous in that discharge of the battery in the event of an accidental short circuit across the positive and negative terminals of connector 330 is prevented. Given the amount of energy stored in the cells of the battery pack, such a discharge could be catastrophic. Thus, in this embodiment, there is no voltage between the positive and negative terminals of connector 330 of the battery pack unless the battery pack is properly mounted in a device configured to provide the appropriate signal to the detect circuit 1100, thus providing for safe handling, storage and transport of the battery back when the battery pack is not connected to either a charger or a device to be powered, such as the mechanical compression device described above.

Figure 7:
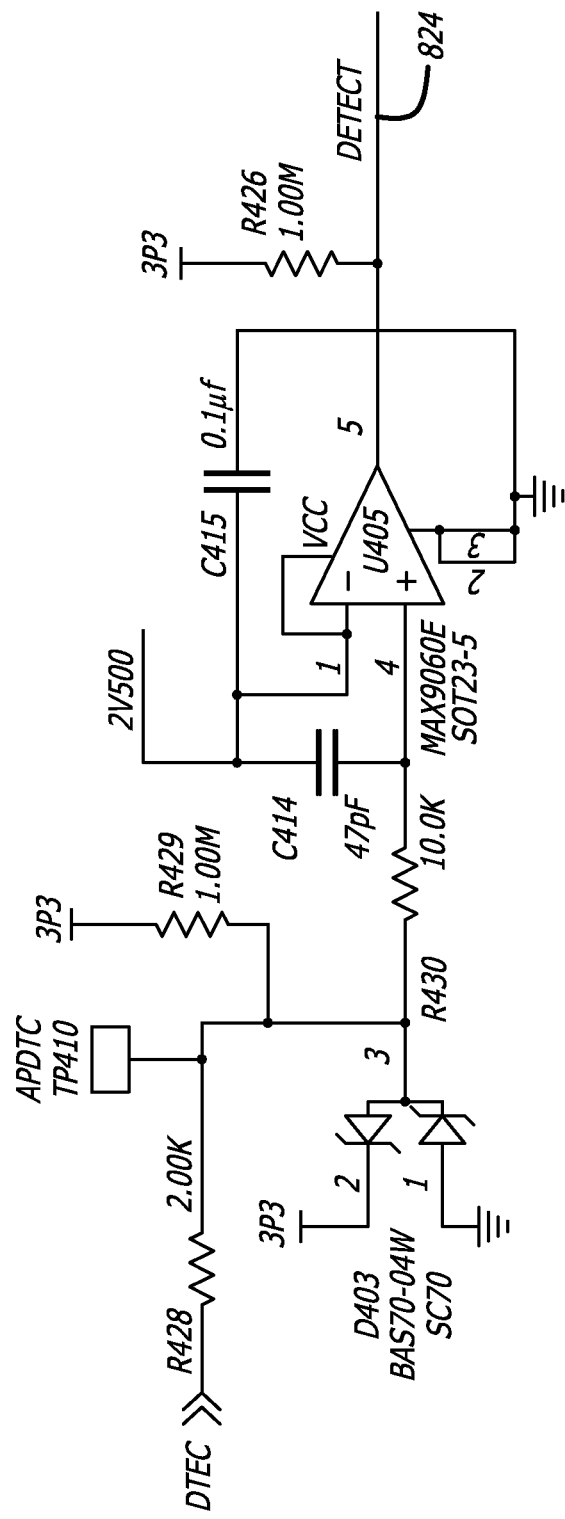
FIG. 7 is a schematic diagram of an embodiment of the present invention showing and exemplary circuit used to detect when the battery is inserted into a device.

Referring now of FIG. 7, an exemplary circuit embodying the present invention is shown. This circuit is a more detailed illustration of box 1100 of FIG. 6. When the battery is plugged into a device configured to communicate with the battery, the connector 330 (FIG. 6) will mate with a suitable connector of the device in which the battery is inserted. As shown, pin 3 of connector 330 is used in this embodiment to receive a signal indicating that the battery is inserted into an appropriate device.

When the battery is inserted into an appropriate device, the connector of the device has a corresponding pin that is grounded. Thus, properly inserting the battery into the device causes pin 3 of connector 330 to be pulled to ground. Pin 3 provides a DTEC signal as shown to the battery management system to indicate that the battery is connected to an appropriate device.

To enable the automatic detection system, resistor R429, having a resistance of one million ohms, pulls the line connected to pin 3 up to the 3.3 voltage supply indicated by 3P3. Thus, when the battery is not inserted into a device, the voltage on pin 3 of connector 330 is approximately 3.3 volts. The current on the DTEC line is limited by R428, having a resistance of 2000 ohm, which works in concert with clamp diode D403 to ensure that the voltage cannot exceed a level which would damage integrated circuit (IC) IC U405. Diode D403 may be, for example, a Schottky barrier double diode, such as the BAS70-04W available from NXP Semiconductors. Use of diode D403 as shown provides protection independent of the polarity of the voltage arriving on the DTEC line, and prevents the voltage from rising to a level may damage IC U405.

In the illustrated embodiment, integrated circuit U405 is, for example, a high speed voltage comparator, such as model MAX9060E, available from MAXIM Integrated Products. U405 is powered by a voltage input into pin 1 of U405. This voltage is typically 2.5 volts, and also provides the reference voltage for the comparator. U405 compares the voltage on pin 4, which is typically 3.3 volts, to the reference voltage of 2.5 volts on pin 1. When the battery is not inserted, pin 4 is at 3.3 volts, which is greater than the voltage at pin 1, so the voltage at output pin 5 of U405 is high. Moreover, the detect line 824 is normally pulled high by the voltage supplied through resistor R426, having a resistance of one million ohms. Pins 2 and 3 of U405 are connected to ground and are decoupled from the rest of the circuit by capacitor C415. Capacitor C414 provides noise filtration and also reduces RF (radio frequency) susceptibility.

When the battery is inserted into a device configured to draw the voltage on the DTEC line low, the voltage on pin 4 goes low, that is, the voltage on pin 4 falls below the reference voltage of 2.5 volts on pin 1 of IC U405, and the voltage on output pin 5 of U405 also goes low.

In this embodiment, line 824 feeds into pack controller 800 (FIG. 6) which is programmed to analyze the signal on line 824 as a low true device detect. In other words, if the voltage on line 824 is high, the battery is not inserted into a device. However, when line 824 goes low, the pack controller 800 determines that the battery has been inserted into an appropriate device, and enables the battery pack for use by providing a signal over the communication bus to primary protection circuit 410 which in turn drives n-FETs 340, 350 and 360 on to close the circuit of the main bus, allowing current to flow to the positive and negative battery terminals of connector 330.

In an alternative embodiment, the pack controller 800 is programmed to monitor the signal on line 824 to determine if the signal being received has an edge, which indicates that the signal is either rising or falling. When an edge is detected, the programming of the pack controller recognizes the edge as an interrupt, which instructs the pack controller to analyze the signal and determine whether is falling, which indicates that the battery has been inserted into the battery compartment of a device, or if the signal is rising, which indicates that the battery has been removed from the device. When the pack controller determines that the signal is falling, the pack controller sends a signal to the primary protection circuit to turn on the n-FETs controlling the flow of current in the front-side bus to provide a voltage across the positive and negative terminals of the battery pack connector, so as to either power a device, such as a mechanical compression device, or accept power from the device, such as a battery charger. Additionally, the same system may be used to allow for testing of the battery when the test device is configured to drive the battery detection circuit to the appropriate state.

Similarly, when the pack controller determines that the detection signal is rising, the pack controller determines that the battery has been removed from the device and the pack controller then provides a signal to the primary protection circuit to turn off the n-FETs controlling the flow of current through the main bus. This results in the voltage across the positive and negative terminals of the connector of the battery pack falling to 0 volts, thus protecting the battery from inadvertent shorting of the positive and negative terminals of the battery connector.

In an alternative embodiment, line 824 may be connected to a mechanical switch or interlock through suitable circuitry to accomplish the same result as described above. In such an embodiment, the mechanical switch or interlock could be closed when the battery was properly inserted into the device to be powered or battery charger to draw the voltage on pin 4 of U405 low, resulting in a low signal on detect line 824.

In still another embodiment, the device to be powered may include a processor that is configured to communicate with the pack controller of the battery pack when the battery is inserted into the battery compartment of the device to be powered. In such an embodiment, an additional level of processing may be performed to ensure that the battery is compatible with the device to be powered. This additional level of processing includes the exchange of dialog between the processors to initiate communications between the processors for controlling the operation of the battery. Such a process is commonly called "handshaking " Moreover, the dialog exchanged between the processors may be encrypted to maintain the secure nature of the dialog exchange and to prevent the use of unauthorized knock off or counterfeit battery packs. Various schemes for such encryption are well known to those skilled in the art. It will also be understood that the handshaking process, with or without encryption, may be used in conjunction with the various embodiments of the device detect circuitry described above, or in some cases, may be used without the device detect circuitry.

While several particular forms of the invention have been illustrated and described, it will be apparent that various modifications can be made without departing from the spirit and scope of the invention.

We claim:

1. A battery connection detection circuit disposed within a battery having connectors for connecting the battery to an equipment to be powered by the battery, for isolating the battery from the battery connectors to prevent a voltage across the connectors when the battery is not connected to the equipment, comprising:

a first reference voltage source and a second reference voltage source;

a detection line driven high by the first reference voltage source;

a comparison circuit for battery connection detection for comparing a signal from the second voltage source to a signal on the detection line, wherein an output for the comparison circuit goes low when the signal on the detection line goes low;

a polarity independent voltage limiting circuit connected between the detection line and the comparison circuit; and a switch controlled by the comparison circuit for isolating the battery from the battery connectors to prevent a voltage across the connectors when the battery is not connected to the equipment, the switch has a low internal resistance.

2. The battery connection detection circuit of claim 1, wherein the polarity independent voltage limiting circuit includes a resistor and a clamping diode.

3. A rechargeable battery for use in a medical device, comprising:
- a battery pack having at least one battery cell;
- a connector disposed on the battery pack, the connector having a positive terminal and a negative terminal in electrical communication with a positive side and a negative side of the at least one battery cell respectively, the connector also have a detection terminal configured to engage a corresponding terminal in a device to be powered by the battery pack;
- a switch disposed between the positive side of the at least one battery cell and the positive terminal of the connector;
- a battery management processor disposed in the battery pack in electrical communication with the battery cell and the switch, the battery management processor programmed to open the switch to isolate the at least one battery cell from the positive terminal to prevent a voltage across the positive and negative terminals when the battery is not inserted into a device configured to accept the battery pack;
- a polarity independent voltage limiting circuit in electrical communication with the detection terminal;
- a battery detection circuit disposed in the battery pack in electrical communication with the polarity independent voltage limiting circuit, the battery detection circuit configured to provide a battery detection signal to the battery management processor when the battery pack is inserted into a device configured to accept the battery pack, the battery detection circuit including a first reference voltage source and a second reference voltage source, a detection line driven high by the first reference voltage source, and a comparison circuit for comparing a signal from the second reference voltage source to a signal on the detection line; and
- wherein the battery management processor provides a signal to the switch to control the switch in response to the battery detection signal to allow current to flow through the switch from the positive side of the at least one battery cell to the positive terminal of the connector.

4. The rechargeable battery of claim 3, wherein the at least one battery cell is based on Lithium-Ion chemistry.

5. The rechargeable battery of claim 3, wherein the switch is a n-channel MOSFET device.

6. The rechargeable battery of claim 3, wherein an output of the battery detection circuit is biased high when the battery pack is not inserted into the device configured to accept the battery pack.

7. The rechargeable battery of claim 6, wherein insertion of the battery pack into the device configured to accept the battery pack drives the output of the battery detection circuit low.

8. The rechargeable battery of claim 3, wherein the battery detection signal has an edge that serves as an interrupt when the edge is received by the battery management processor.

9. The rechargeable battery of claim 8, wherein the edge is a falling edge formed as the detection signal drops from a high condition to a low condition.

10. The rechargeable battery of claim 9, wherein the detection signal drops from the high condition to the low condition when the detection terminal of the connector engages the corresponding terminal in the device configured to accept the battery pack.

11. The rechargeable battery of claim 10, wherein the corresponding terminal in the device configured to accept the battery pack is connected to ground.

12. The rechargeable battery of claim 8, wherein the battery management processor receives the interrupt and analyzes the detection signal to determine whether the signal has a high condition or a low condition.

13. The rechargeable battery of claim 12, wherein the battery management processor provides a signal to the switch to allow current to flow through the switch if the detection signal has the low condition.

14. The rechargeable battery of claim 3, wherein the battery detection circuit includes a detection line biased with a first voltage and a reference line biased with a second voltage, and also having a comparison circuit for comparing the first voltage to the second voltage, the comparison circuit having an output having a first condition when the first voltage is greater than the second voltage and a second condition when the first voltage is less than the second voltage.

15. The rechargeable battery of claim 14, where the second condition indicates that the battery pack has been inserted into the device configured to accept the battery pack.

16. The rechargeable battery of claim 14, wherein the comparison circuit includes an operational amplifier configured as a comparator.

17. The rechargeable battery of claim 3, wherein the battery detection circuit includes static electricity protection components.

18. The rechargeable battery of claim 3, wherein the switch is a mechanical switch or interlock.

19. The rechargeable battery of claim 3, wherein the battery management processor is configured to provide a handshaking signal through the connector to the device to be powered.

20. The rechargeable battery of claim 19, wherein the handshaking signal is encrypted.

21. The rechargeable battery of claim 3, wherein the polarity independent voltage limiting circuit includes a resistor and a clamping diode.

* * * * *